United States Patent [19]

Itaba et al.

[11] 4,337,300

[45] Jun. 29, 1982

[54] SURFACE-COATED BLADE MEMBER FOR CUTTING TOOLS AND PROCESS FOR PRODUCING SAME

[75] Inventors: Takeshi Itaba; Shotaro Matsumoto, both of Tokyo, Japan

[73] Assignee: Mitsubishi Kinzoku Kabushiki Kaisha, Tokyo, Japan

[21] Appl. No.: 176,272

[22] Filed: Aug. 8, 1980

[30] Foreign Application Priority Data

Aug. 9, 1979 [JP] Japan .................................. 54-101540

[51] Int. Cl.$^3$ ..................... B32B 15/18; C23C 11/02; C23C 11/08
[52] U.S. Cl. .................................... 428/627; 427/249; 427/250; 427/255.2; 427/255.3; 427/255.7; 428/628; 428/629; 428/660; 428/684; 428/926; 428/938
[58] Field of Search ............... 428/628, 629, 623, 627, 428/660, 681–685, 926, 938; 427/249–255.7; 148/31.5

[56] References Cited

U.S. PATENT DOCUMENTS

| | | | |
|---|---|---|---|
| 2,857,663 | 10/1958 | Beggs ................................... | 428/660 |
| 3,684,585 | 8/1972 | Stroup et al. ....................... | 148/31.5 |
| 3,874,900 | 4/1975 | Post et al. ........................... | 148/31.5 |
| 4,226,082 | 10/1980 | Nishida .............................. | 428/627 |

FOREIGN PATENT DOCUMENTS

| | | | |
|---|---|---|---|
| 2528255 | 2/1976 | Fed. Rep. of Germany ... | 427/255.7 |
| 2357321 | 2/1978 | France ................................ | 428/627 |

*Primary Examiner*—Michael L. Lewis
*Attorney, Agent, or Firm*—Cushman, Darby & Cushman

[57] ABSTRACT

The surface-coated blade member for cutting tools comprises a metal substrate and a coating on at least one surface of said substrate, said coating composed of a layer of vapor deposited titanium on the surface of said metal substrate and at least one layer of vapor deposited titanium compound on said layer of titanium, and said layer of titanium compound being selected from the group consisting of titanium carbide, titanium nitride, titanium carbonitride, titanium oxy-carbide and titanium oxy-carbo-nitride, said layer of titanium being no larger than 2 μm thick and said layer of titanium compound being 0.5 to 10 μm thick. A process for producing such a blade member is also disclosed.

8 Claims, No Drawings

SURFACE-COATED BLADE MEMBER FOR CUTTING TOOLS AND PROCESS FOR PRODUCING SAME

BACKGROUND OF THE INVENTION

1. Field of the Invention

This invention relates to a surface-coated blade member or insert adapted to be secured to a body of a cutting tool by brazing or other suitable fastening means. The blade member comprises a metal substrate of high speed steel on which a hard coating is formed by vapor deposition.

2. Prior Art

It is known from Japanese Patent Application No. 53-34813 to provide a surface-coated blade member under consideration which comprises a metal substrate of high speed steel, and a hard coating on the surface of the substrate, said coating being composed of at least one layer of vapor deposited titanium compound on the surface of the substrate, and the titanium compound being selected from the group consisting of titanium carbide (TiC), titanium nitride (TiN), titanium carbonitride (TiCN), titanium oxy-carbide (TiCO), and titanium oxy-carbo-nitride (TiCNO). The layer of titanium compound is 0.5 to 10 μm thick.

This conventional blade member has been found not satisfactory in that the strength of bonding between the coating and the substrate is not so high that this titanium compound coating is susceptible to separation from the substrate surface when the blade member is used to carry out a cutting operation. This difficulty arises from the fact that atoms of the constituents of the substrate fail to positively combine with atoms of titanium contained in the coating since atoms of carbon, nitrogen and oxygen contained in the coating lower activity in the surface of the substrate.

If a titanium compound is deposited on the substrate to form a coating of the type described at elevated temperatures, the bonding between the coating and the substrate is enhanced since the diffusion of atoms between the substrate and the coating takes place sufficiently to promote the combination of the atoms. However, this procedure is not practical because the metal substrate becomes deteriorated by the high temperatures used. More specifically, the properties of the substrate becomes changed because the metal atoms of the substrate are diffused into the coating. Further, since the metal substrate is made of high speed steel, the effect achieved by the heat treatment is lost.

U.S. Pat. No. 3,874,900 discloses a coating method in which a coating is applied to a metal substrate by chemical vapor deposition. The coating comprises a layer of titanium carbide and a layer of titanium nitride. In forming the titanium carbide layer, an interlayer of carbon, titanium, titanium carbide and metal of the substrate is formed between the substrate and the titanium carbide layer. This method has also been found not satisfactory in that the metal substrate is diffused into the coating because the chemical vapor deposition is carried out at high temperatures of 900° C. to 1200° C. As a result, the properties of the substrate become changed.

SUMMARY OF THE INVENTION

It is therefore an object of this invention to provide a surface-coated blade member for cutting tools in which the bonding of a hard coating to a metal substrate is highly enhanced to provide a high wear resistance.

Another object is to provide a process for producing such a blade member.

According to a first aspect of the present invention, there is provided a surface-coating blade member for cutting tools which comprises a metal substrate and a coating on at least one surface of said substrate, said coating being composed of a layer of vapor deposited titanium on the surface of said metal substrate and at least one layer of vapor deposited titanium compound on said layer of titanium, and said layer of titanium compound being selected from the group consisting of titanium carbide, titanium nitride, titanium carbonitride, titanium oxy-carbide and titanium oxy-carbonitride, said layer of titanium being no larger than 2 μm and said layer of titanium compound being 0.5 to 10 μm thick.

With this structure, the strength of bonding between the metal substrate and the layer of titanium is high, and also the strength of bonding between the layer of titanium and the layer of titanium compound is high. Thus, the bonding of the hard coating, i.e., the layer of titanium compound to the metal substrate is highly enhanced through the intermediary of the layer of titanium interposed therebetween. The reason why the strength of bonding between the metal substrate and the layer of titanium is high is that titanium atoms are quite active and that the substrate is not subjected at its surface to nonmetal atoms which lower the activity in the substrate surface, such nonmetal atoms being diffused and dissolved in the titanium layer. Therefore, the titanium atoms positively combine with the metal atoms of the substrate. Also, the reason why the strength of bonding between the layer of titanium and the layer of titanium compound is high is that the titanium atoms are quite active and that these two layers have common metal atoms, that is, titanium atoms.

The thickness of the layer of titanium is no larger than 2 μm. If the thickness exceeds this value, the overall coating becomes less hard and has a lowered wear resistance. This will shorten a service life of the blade member. Particularly, in the case of the titanium layer having a thickness not exceeding 0.9 μm, the blade member exhibits a marked wear resistance. The layer of titanium compound is 0.5 to 10 μm thick. If the thickness is less than 0.5 μm, the coating fails to have a desired wear resistance. On the other hand, if the thickness exceeds 10 μm, the coating become brittle and less tough.

Another advantage of the provision of the layer of titanium is that this layer is capable of absorbing the stresses exerted on the blade member during a cutting operation. During the cutting operation, the blade member is subjected to substantial stresses. In the absence of such titanium layer, the hard coating, i.e., the layer of titanium compound is susceptible to stress cracking and subsequent separation from the metal substrate during the cutting operation because the hard coating does not have deformability and therefore fails to follow the deformation of the substrate. The layer of titanium suitably absorbs such stresses and prevents the overall coating from being separated from the substrate.

According to a second aspect of the present invention, there is provided a process for producing a surface-coated blade member for cutting tools, which comprises the steps of: placing a metal substrate in a vacuum chamber; vapor depositing no larger than 2 μm thick layer of titanium on at least one surface of said substrate; and subsequently vapor depositing at least one layer of titanium compound on said layer of titanium to form a coating on said substrate, said layer of titanium compound being 0.5 to 10 μm thick, and said titanium compound being selected from the group consisting of titanium carbide, titanium nitride, titanium carbo-nitride, titanium oxy-carbide and titanium oxy-carbo-nitride.

With this method, the layer of titanium and the layer of titanium compound are successivey formed by vapor deposition in the vacuum chamber. The layer of vapor deposited titanium should not be exposed to the atmosphere since the oxides of titanium are formed on this layer. This would adversely affect the strength of bonding between the layer of titanium and the subsequently vapor deposited layer of titanium compound.

During the vapor depositing operation, the metal substrate should preferably be maintained at temperatures of no less than 300° C. If the temperature of the substrate is below 300° C., the atoms of carbon, nitrogen and oxygen fail to be sufficiently diffused into the layer of titanium. As a result, residual such atoms lower the strength of bonding between the two layers.

The substrate made of high speed steel should preferably be maintained at temperatures of no more than 600° C. If the temperature of the substrate is above the tempering temperature, the effect achieved by the heat treatment is lost.

Further, since the vapor deposition of the layers are carried out at relatively low temperatures, the metal atoms of the substrate will not be diffused into the coating so that the properties of the substrate are not changed.

The layer of titanium and the layer of titanium compound are formed either by a conventional physical vapor deposition process such as an ion plating process and a sputtering process or a chemical vapor deposition process such as one using a low temperature plasma.

DESCRIPTION OF THE INVENTION

The invention will now be illustrated by the following examples.

EXAMPLE 1

There was prepared, as a substrate, a throw-away blade member or insert made of high speed steel of JIS (The Japanese Industrial Standards).SKH-9 (corresponding to AISI.M2 or VDEh.S6-5-2) and conforming in shape to a blade member of JIS.SNP 432 (ISO.SNGN 120408). There was used an ion plating apparatus of the type in which an electron beam was applied to a titanium block supported on a support means mounted within a vacuum chamber so that the vapored titanium and gases introduced into the vacuum chamber were allowed to pass through the plasma within the vacuum chamber. The above-mentioned blade member or substrate was first placed within the vacuum chamber. Then, 0.1 μm thick layer of titanium was vapor deposited on the surface of the substrate at a heat temperature of 500° C. in an argon atmosphere. Subsequently, 3 μm thick layer of titanium compound (TiCN) was vapor deposited on the layer of titanium by replacing the argon gas with a mixture gas of $N_2$, $C_2H_2$ and Ar to provide a surface coated blade member of high speed steel (hereinafter referred to as "the blade member of this invention")

For comparison purposes, a comparison blade member was prepared according to the above procedure except that the layer of titanium was not provided. Using the Rockwell hardness tester, a coating separation test was carried out in which a dent was applied under a load of 50 kg to the coated surface of each of the two blade members, and the coating was observed to determine whether any separation of the coating from each substrate took place around the applied dent. The coating of the blade member of this invention was subjected to no separation and exhibited an excellent bonding strength. On the other hand, the coating of the comparison blade member was separated from the substrate around the applied dent and exhibited a poor bonding strength.

A throw-away blade member identical to that of this invention but having no coating was also prepared. This blade member is hereinafter referred to as "the non-coating blade member".

The blade member of this invention, the comparison blade member and the non-coating blade member were each attached to a holder of JIS.N11R-44 to provide a cutting tool of JIS.SNPR 432 (ISO SNGG 120408R). These three cutting tools were used to turn a workpiece to determine how long it took for the flank of each blade member to be worn 0.3 mm. The cutting conditions for this turning test were as follows:

Workpiece: a circular cross-section bar of alloyed steel (JIS.SCM-4 corresponding to AISI.4140 or DIN 17200-42CrMo4; Hardness HB: 180)
Cutting speed: 15 m/minute
Feed rate: 0.05 mm/revolution
Depth of cut: 1 mm
Coolant: used The results obtained are given in Table 1.

TABLE 1

| Kind of blade member | Time of cutting (min.) | Results of separation test |
| --- | --- | --- |
| Blade member of this invention | 200 | No separation developed |
| Comparison blade member | 60 | Separation developed |
| Non-coating blade member | 50 | — |

As can be seen from Table 1, the blade member of this invention exhibited a quite high bonding strength of the coating by virtue of the provision of the layer of titanium interposed between the substrate and the layer of titanium compound, and was subjected to no separation of the coating. The cutting time of the present blade member was substantially longer than those of the other two blade members. Thus, the present blade member turned out to have an excellent cutting performance.

EXAMPLE 2

Throw-away blade members or inserts described in Example 1 were prepared as substrates. A coating was formed on each of these substrates by an ion plating apparatus of the type described in Example 1 or a sputtering apparatus to provide coated blade members 1 to 9 of this invention and comparison blade members 1 to 5 as shown in Table 2. With the sputtering apparatus, a target of titanium accommodated within a vacuum chamber was subjected to sputtering in a predetermined atmosphere. For example, TiCNO, a layer of titanium compound, was vapor deposited in an atmosphere of Ar, $N_2$, $CO_2$ and $C_2H_2$, TiC in an atmosphere of Ar and $C_2H_2$, and TiN in an atmosphere of Ar and $N_2$.

The coating separation test and turning test of these blade members were carried out according to the procedure of Example 1. The results obtained are given in Table 2 below. The hard coating of each of the comparison blade members 1 and 2 having no titanium layer was subjected to separation, and therefore the flank of each blade member was worn 0.3 mm in a relatively short period of time. Although the comparison blade member 3 had the layer of titanium, the layer of titanium compound had a thickness of 11 μm which is beyond the upper limit of this invention. This blade member gave rise to chipping in a quite short time. Thus, this blade member turned out to have quite a short service life. The comparison blade members 4 and 5, in which the temperature of the substrate had exceeded the upper limit of 600° C. in this invention, had the coatings which were subjected to separation in a short time.

On the other hand, by virtue of the provision of the titanium layer interposed between the substrate and layer of titanium compound, the blade members 1 to 9 of this invention exhibited a quite high bonding strength of the coating, and possessed a great wear resistance. Further, the thinner the titanium layer was, the higher wear resistance the blade members of this invention exhibited. This is clearly seen from the data of the blade members 5, 7, 8 and 9 of this invention. Particularly, the blade members, having the titanium layer thickness not exceeding 0.9 μm, exhibited a marked wear resistance.

TABLE 2

| Kind of coated blade member | | Apparatus used | Coating temperature (Temperature of substrate) | Thickness of titanium layer (μm) | Constituents and thickness of layer of titanium compound (μm) | Result of separation test | Time of cutting (min.) |
|---|---|---|---|---|---|---|---|
| Blade members of this invention | 1 | Ion plating | 550° C. | 0.5 | TiN:2 | no separation developed | 150 |
| | 2 | " | 500° C. | 1 | TiCN:1 + TiN:9 | no separation developed | 400 |
| | 3 | " | 400° C. | 2 | TiCO:0.5 + TiC:3 | no sepatation developed | 250 |
| | 4 | " | 300° C. | 1 | TiC:1 + TiCN:1 + TiN:1 | no separation developed | 250 |
| | 5 | Sputtering | 400° C. | 1 | TiC:3 | no separation developed | 300 |
| | 6 | " | 400° C. | 1 | TiCNO:5 | no separation developed | 400 |
| | 7 | " | 400° C. | 0.9 | TiC:3 | no separation developed | 400 |
| | 8 | " | 400° C. | 0.7 | TiC:3 | no separation developed | 450 |
| | 9 | " | 400° C. | 0.3 | TiC:3 | no separation developed | 550 |
| Comparsion blade members | 1 | Ion plating | 550° C. | — | TiN:2 | substantial separation developed | 60 |
| | 2 | " | 550° C. | — | TiCN:1 + TiN:9 | substantial separation developed | 70 |
| | 3 | " | 550° C. | 1 | TiN:11 | substantial separation developed | chipping developed in ten minutes |
| | 4 | " | 650° C. | 1 | TiC:5 | substanial separation developed | 60 |
| | 5 | " | 250° C. | 1 | TiN:5 | substantial separation developed | 60 |

What is claimed is:

1. A process for producing a surface-coated blade member for cutting tools, which comprises the steps of:
    (a) placing a metal substrate in a vacuum chamber;
    (b) vapor depositing no larger than 0.9 μm thick layer of titanium on at least one surface of said substrate; and subsequently
    (c) vapor depositing at least one layer of titanium compound on said layer of titanium to form a coating on said substrate while maintaining the substrate at a temperature between about 300° C. to about 600° C. during the vapor deposition, said layer of titanium compound being 0.5 to 10 μm thick to thereby impact maximum wear resistance to said coating, and said titanium compound being selected from the group consisting of titanium carbide, titanium nitride, titanium carbo-nitride, titanium oxy-carbide and titanium oxy-carbo-nitride.

2. A surface-coated blade member for cutting tools which comprises:
    a metal substrate and
    a coating on at least one surface of said substrate, said coating being composed of
    a layer of vapor deposited titanium on the surface of said metal substrate, and at least one layer of vapor deposited titanium compound on said layer of titanium, said layer of titanium compound being selected from the group consisting of titanium carbide, titanium nitride, titanium carbo-nitride, titanium oxy-carbide, said layer of titanium being no larger than 0.9 μm thick and said layer of titanium compound being 0.5 to 10 μm thick, thereby imparting maximum wear resistance to said coating, said blade member produced by the process of claim 3.

3. A process according to claim 1 wherein the vapor deposited titanium layer is from 0.1 up to 0.9 μm in thickness.

4. A process according to claim 1 wherein the vapor deposited titanium layer is from about 0.3 up to no greater than 0.7 μm in thickness.

5. A blade member according to claim 2, in which said metal substrate is high-speed steel.

6. A blade member according to claim 2 or 5 wherein the vapor deposited titanium layer is from 0.3 up to 0.9 μm in thickness.

7. A surface-coated cutting tool blade member comprising:
  a metal substrate,
  a coating on at least one surface of said substrate composed of:
    a layer of vapor deposited titanium of from 0.1 up to no larger than 0.9 μm in thickness deposited on the surface of said substrate, and
    at least one layer from 0.5 to 10 μm in thickness of a titanium compound selected from the group consisting of titanium carbide, titanium nitride, titanium carbo-nitride, titanium oxy-carbide and titanium oxy-carbo-nitride said blade member produced by the process of claim 3.

8. A blade member according to claim 2, 5 or 7 wherein the vapor deposited titanium layer is from about 0.3 up to no greater than 0.7 μm in thickness.

* * * * *